United States Patent
Chong et al.

(10) Patent No.: US 11,675,386 B2
(45) Date of Patent: Jun. 13, 2023

(54) SYSTEM AND METHOD FOR RECOVERING A CLOCK SIGNAL

(71) Applicant: HUAWEI TECHNOLOGIES CO., LTD., Guangdong (CN)

(72) Inventors: Euhan Chong, Kanata (CA); Mohammad Sadegh Jalali, Ajax (CA); Behzad Dehlaghi, Vaughan (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/397,277

(22) Filed: Aug. 9, 2021

(65) Prior Publication Data

US 2023/0041998 A1    Feb. 9, 2023

(51) Int. Cl.
*G06F 1/12*    (2006.01)
*G06F 1/10*    (2006.01)

(52) U.S. Cl.
CPC . *G06F 1/12* (2013.01); *G06F 1/10* (2013.01)

(58) Field of Classification Search
CPC ..................................... G06F 1/12; G06F 1/10
See application file for complete search history.

(56) References Cited

U.S. PATENT DOCUMENTS

| 6,704,892 | B1* | 3/2004 | Kurd | G01R 31/31725 |
| | | | | 714/E11.169 |
| 2004/0164779 | A1* | 8/2004 | Cucchi | G06F 1/10 |
| | | | | 327/231 |
| 2005/0265487 | A1* | 12/2005 | Sou | H03L 7/091 |
| | | | | 375/326 |
| 2008/0008282 | A1* | 1/2008 | Ikeda | G06F 1/08 |
| | | | | 375/371 |
| 2013/0049831 | A1 | 2/2013 | Nedachi | |
| 2014/0086364 | A1 | 3/2014 | Schell et al. | |
| 2018/0069554 | A1 | 3/2018 | Chen et al. | |
| 2021/0126643 | A1* | 4/2021 | Tripodi | H03K 7/08 |
| 2021/0200257 | A1* | 7/2021 | Huang | H03K 5/1565 |
| 2022/0197330 | A1* | 6/2022 | Xavier | H03L 7/0818 |

FOREIGN PATENT DOCUMENTS

| CN | 105634451 A | 6/2016 |
| CN | 107836094 A | 3/2018 |
| CN | 110073602 A | 7/2019 |

OTHER PUBLICATIONS

Yousry, R. et al., A 1.7pJ/b 112Gb/s XSR Transceiver for Intra-package Communication in 7nm FinFET Technology, Advance Wireline Links and Techniques, Session 11, IEEE International Solid-State Circuits Conference, Feb. 17, 2021.

(Continued)

*Primary Examiner* — Phil K Nguyen
(74) *Attorney, Agent, or Firm* — BCF LLP

(57) ABSTRACT

Systems and methods for clock recovery are disclosed. The method comprises generating, by a first dynamic phase interpolator, a first center clock signal, and generating, by a second dynamic phase interpolator, a second center clock signal. The method further comprises outputting, by a static phase interpolator, an edge clock signal based on the first and second center clock signals.

18 Claims, 12 Drawing Sheets

(56) References Cited

OTHER PUBLICATIONS

Shahramian, S. et al., A 1.41pJ/b 56Gb/s PAM-4 Wireline Received Employing Enhanced Pattern Utilization CDR and Genetic Adaptation Algorithms in 7nm CMOS, Advance Wireline Techniques, session 30, IEEE International Solid-State Circuits Conference, Feb. 20, 2019.

Shivnaraine, R. et al., A26.5625-to-106.25Gb/s XSR SerDes with 1.55pJ/b Efficiency in 7nm CMOS, Advance Wireline Links and Techniques, Session 11, IEEE International Solid-State Circuits Conference, Feb. 17, 2021.

International Search Report and Written Opinion issued in co-pending International application No. PCT/CN2022/109516 dated Oct. 27, 2022.

\* cited by examiner

SYSTEM AND METHOD FOR RECOVERING A CLOCK SIGNAL

CROSS-REFERENCE TO RELATED APPLICATIONS

This is the first application filed for the instantly disclosed technology.

TECHNICAL FIELD

The present disclosure relates to the field of digital communication technology and in particular to method implemented in a system for recovering a clock signal for sampling a data stream.

BACKGROUND

In many technologies, digital data streams are transmitted without a clock signal. Clock recovery is required at a data receiver end in order to retrieve the transmitted data by sampling the data stream with the correct clock signal. To this end, the data receiver generates a clock from an approximate frequency reference, and then phase-aligns the generated clock with the data stream. This process is known as clock-data recovery (CDR).

A number of techniques have been developed to accomplish CDR. Analog mixed signal (AMS) wireline data receivers usually comprise a CDR block that use phase detectors (PDs) to extract the transmitted clock phase and frequency. To do so, the PDs typically over sample the unit interval (UI) of the data stream by a factor of two (2x), one at the UI center, using a center clock signal, and the other at the UI edge, using an edge clock signal.

As the data rate increases, clock generation for 2x sampling becomes more challenging. Sub-rate CDR blocks are sometimes used to somewhat mitigate this challenge. A half-rate 2x CDR uses two phases of the clock to sample the data center and another two phases of the clock to sample the data edge. A quarter-rate 2x CDR uses four clock phases to sample the data center and four clock phases to sample the edge. As such, as the number of clock phases increases, the frequency of the clock decreases, reducing the clock generation and distribution complexity and power. Phase interpolators (PIs) are typically used for the purpose of tracking the phase and frequency of the incoming data stream by generating clock phases, or clock signals for the CDR block. However, since one PI may generate two clock phases, the number of PIs needed may rise, increasing total PI area within data receiver chips.

Conventional clock recovery solutions implemented in data receivers, for example high-speed data receivers such as analog mixed-signal (AMS) data receivers, require complex front-end architectures that occupy significant amounts of area within data receiver chips and that consume significant amounts of power.

Consequently, clock recovery techniques which can be implemented with less complexity and power consumption are desirable.

SUMMARY

An aspect of the present disclosure is to provide a clock recovery method comprising: generating, by a first dynamic phase interpolator (PI), a first center clock signal; generating, by a second dynamic PI, a second center clock signal; and outputting, by a static PI, an edge clock signal based on the first and second center clock signals.

In at least one embodiment, outputting, by the static PI, the edge clock signal based on the first and second center clock signals comprises: receiving, by a first inverter of the static PI, the first center clock signal; receiving, by a second inverter of the static PI, the second center clock signal; and combining outputs of the first and second inverters.

In at least one embodiment, the first and second center clock signals are generated with a 90° phase shift.

In at least one embodiment, the first and second dynamic PIs are Current Mode Logic PIs.

In at least one embodiment, the static PI is a Complementary Metal Oxide Semiconductor PI.

In at least one embodiment, generating, by the first dynamic PI, the first center clock signal comprises: receiving, by the first dynamic PI a first reference clock signal, a second reference clock signal having a +90° phase shift with the first reference clock signal, a third reference clock signal having a +90° phase shift with the second reference clock signal, and a fourth reference clock signal having a +90° phase shift with the third reference clock signal.

In at least one embodiment, generating, by the first dynamic PI, the first center clock signal comprises receiving, by the first dynamic PI, a first phase code for weighting the first, second, third and fourth reference clock signals to adjust a phase of the first center clock signal.

In at least one embodiment, the method further comprises adjusting, based on a feedback system, the first phase code received by the first dynamic PI.

In at least one embodiment, generating, by the second dynamic PI, the second center clock signal comprises: receiving, by the second dynamic PI, the first reference clock signal, the second reference clock signal having a +90° phase shift with the first reference clock signal, the third reference clock signal having a +90° phase shift with the second reference clock signal, and the fourth reference clock signal having a +90° phase shift with the third reference clock signal.

In at least one embodiment, generating, by the second dynamic PI, the second center clock signal comprises receiving a second phase code for weighting the first, second, third and fourth reference clock signals to adjust a phase of the first center clock signal.

In at least one embodiment, the static PI is a first static PI and the edge clock signal is a first edge clock signal, the method further comprising: generating, by the first dynamic PI, a third center clock signal; generating, by the second dynamic PI, a fourth center clock signal; outputting, by a second static PI, a second edge clock signal based on the third and fourth center clock signals.

In at least one embodiment, the second static PI is a Complementary Metal Oxide Semiconductor PI.

In at least one embodiment, the fourth center clock signal is generated with a +90° phase shift from the third center clock signal.

In at least one embodiment, generating, by the first dynamic PI, the third center clock signal comprises generating an inverted signal from the first center clock signal.

In at least one embodiment, generating, by the second dynamic PI, the fourth center clock signal comprises generating an inverted signal from the second center clock signal.

In at least one embodiment, the method further comprises outputting, by the first and second static PIs, a third edge clock signal and a fourth edge clock signal respectively, the third edge clock signal being an inverted signal generated from the first edge clock signal, and the fourth edge clock signal being an inverted signal generated from the second edge clock signal.

In at least one embodiment, the method further comprises using the first, second, third and fourth center clock signals and the first, second, third and fourth edge clock signals to sample a received data stream.

Another aspect of the present disclosure is to provide a system comprising a processor and a memory; the memory comprising instructions which, upon being executed by the processor: cause a first dynamic phase interpolator (PI) to generate a first center clock signal; cause a second dynamic PI to generate a second center clock signal; and cause a static PI to output an edge clock signal based on the first and second center clock signals.

In at least one embodiment, the static PI is a first static PI and the edge clock signal is a first edge clock signal, and wherein the execution of the instructions by the processor further causes: the first dynamic PI to generate a third center clock signal; the second dynamic PI to generate a fourth center clock signal; and a second static PI to output a second edge clock signal based on the third and fourth center clock signals.

In at least one embodiment, the execution of the instructions by the processor further causes the first and second static PIs to output a third edge clock signal and a fourth edge clock signal respectively, the third edge clock signal being an inverted signal generated from the first edge clock signal, and the fourth edge clock signal being an inverted signal generated from the second edge clock signal, the first, second, third and fourth center clock signals and the first, second, third and fourth edge clock signals being further used to sample a received data stream.

BRIEF DESCRIPTION OF THE FIGURES

The features and advantages of the present disclosure will become apparent from the following detailed description, taken in combination with the appended drawings, in which.

Figure 1A:
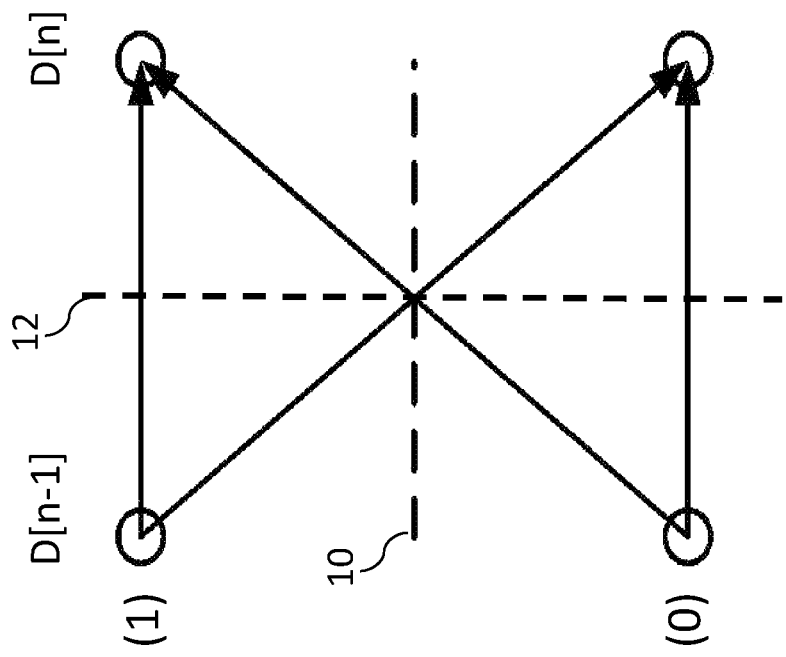
FIGS. 1a and 1b respectively represent transitions between binary and quaternary symbols received at a receiver.

It is to be understood that throughout the appended drawings and corresponding descriptions, like features are identified by like reference characters. Furthermore, it is also to be understood that the drawings and ensuing descriptions are intended for illustrative purposes only and that such disclosures are not intended to limit the scope of the claims.

DETAILED DESCRIPTION

Various representative embodiments of the disclosed technology will be described more fully hereinafter with reference to the accompanying drawings, in which representative embodiments are shown. The presently disclosed technology may, however, be embodied in many different forms and should not be construed as limited to the representative embodiments set forth herein. Rather, these representative embodiments are provided so that the disclosure will be thorough and complete, and will fully convey the scope of the present technology to those skilled in the art. In the drawings, the sizes and relative sizes of layers and regions may be exaggerated for clarity. Like numerals refer to like elements throughout. And, unless otherwise defined, all technical and scientific terms used herein have the same meaning as commonly understood by one of ordinary skill in the art to which the described embodiments pertain.

Generally speaking, a phase interpolator (PI) gets two input clock signals, which are 90 degrees apart, as well as a phase code, which is described in detail herein below, and produces an output whose phase is between the phases of its input clock signals, as per the phase code. Two topologies are typically used to implement PIs. Current mode logic (CML) PIs perform interpolation between two clock phases by dividing a reference current between them. The phase of the output clock is controlled by controlling how much of the reference current is steered towards each clock phase. This is typically done using a conventional Digital-to-Analog Converter (DAC).

Complementary Metal Oxide Semiconductor (CMOS) PIs perform phase interpolation by mixing the two input clock signals with different strength in voltage domain. Each generated clock phase is first buffered and then the buffered outputs are combined with each other to form an output clock signal. By controlling the strength of each buffer, the phase of the output clock signal is set between phases of the two input clock phases.

In some experimental implementations, there may be a frequency offset between the frequency of the data stream (i.e. inverse of a duration of one unit interval (UI)) and a frequency of a clock signal generated by the PI. More specifically, it can be said that there is a frequency offset when those two frequencies are not a multiple of each other. Therefore, in order to track frequency offset, the phase code is constantly updated by the clock-data recovery (CDR) to make the phase of the output clock signal generated by the PI shift to track the phase of the data stream. As such, it can be said that the PI "rotate. A CMOS PI is described in greater detail hereinafter.

CML PIs have a superior performance compared to CMOS PIs. This is because the load of the buffers in CMOS PIs changes with the phase code, as load of an 'off' inverter is not the same as that of an 'on' inverter. Furthermore, techniques implemented to improve the performance of the CMOS PI in the presence of a frequency offset, also known as PI linearity, typically affect high speed performances. In the context of the present disclosure, PI linearity may be defined as how constant a variation (i.e. the phase resolution) of the phase of the output signal generated by the PI is as the phase code is updated. For a perfectly linear PI, the phase resolution remains the same for all phase codes. However, in a PI with non-linearity, the phase resolution varies from phase code to phase code.

Techniques implemented to improve PI linearity performance of the CML PIs typically focus on how the reference current is divided between the two clock phases. Adjusting said reference current is independent from the high speed signal path of the CIVIL PIs, such that the PI linearity may be optimized without affecting high speed performances.

Figure 1B:
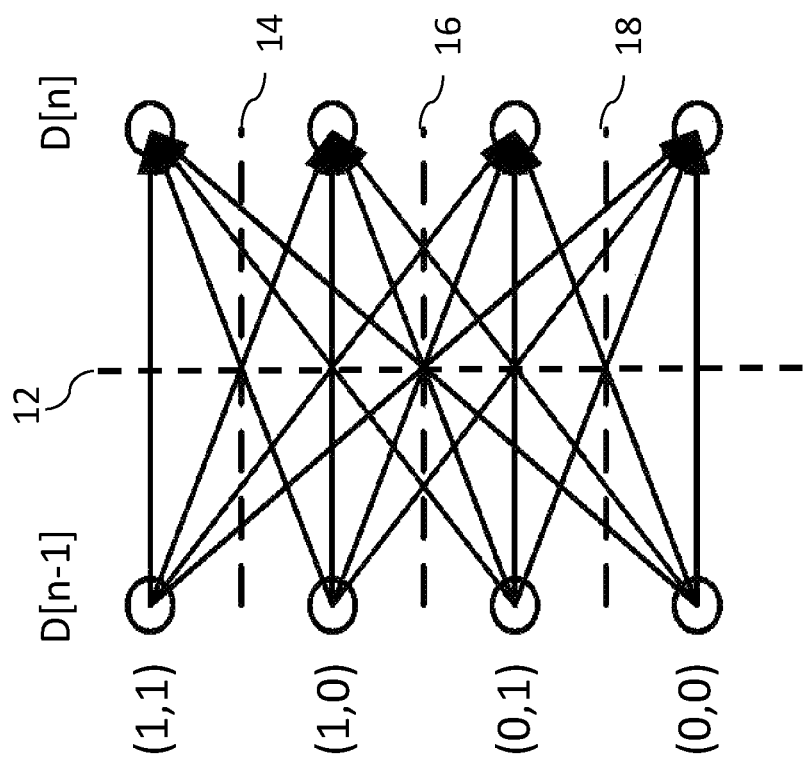

Referring now to the drawings, FIGS. 1a and 1b respectively represent transitions between binary and quaternary symbols received at a data receiver. On FIG. 1a, data samples at times (n−1) and (n), identified as "D[n−1]" and "D[n]" can have logical values 0 or 1. A time delay between D[n−1] and D[n] is called a unit interval (UI) and the data samples D[n−1] and D[n] are most easily detected at the center of corresponding UIs, which are half-UI away from edge of corresponding UIs represented as time 12. Between the time (n−1) and the time (n), the logical values of the data samples may remain unchanged or may vary from 0 to 1 or from 1 to 0. These changes in the values of the data samples are perceived at the data receiver as physical transitions (i.e. electrical or optical) that the data receiver may use for clock recovery purposes. Without limitation and for illustration purposes, a data sample having a logical value of 1 may be represented by a symbol voltage of +3 volts and a data sample having a logical value of 0 may be represented by a symbol voltage of −3 volts. If D[n−1] is a logical 1 and D[n] is a logical 0, the symbol voltage passes through a 0-volt threshold 10 between D[n−1] and D[n]. Assuming that D[n−1] and D[n] are received without any time jitter or other distortion, transitions pass through the 0-volt threshold at an ideal time 12, which is a time of an ideal transition time at an edge between consecutive UIs. Between each data sample, the data receiver detects an edge sample E[n−1] according to an internal clock and uses these edge sample E[n−1] to align the internal clock (hereinafter a "recovered clock") with a clock that is inherently present in a signal carrying the successive data samples D[n−1] and D[n] (hereinafter a "clock signal"). Once the recovered clock is synchronized with the clock signal, the data receiver can optimally detect the data samples D[n−1] and D[n].

If D[n] is the same as D[n−1], there is no voltage change or other physical transition useable at the data receiver for clock recovery purposes. Assuming an equal probability that each successive data sample is a logical 1 or 0, transition density of the binary stream of FIG. 1a is 50%.

On FIG. 1b, data samples D[n−1] and D[n] each carry two (2) bits, as in the case for example of a 4-PAM signal. Without limitation and for illustration purposes, a data sample having a logical value of (1,1) may be represented by a symbol voltage of +3 volts, a data sample having a logical value of (1,0) may be represented by a symbol voltage of +1 volt, data samples having logical value of (0,1) and (0,0) being respectively represented by symbol voltages of −1 volt and −3 volts. Transition density is 75% in the sense that D[n] differs in value from D[n−1] 75% of the times, assuming an even probability density of the symbol values. However, among those 75% transitions, the data receiver can only use some of them for clock recovery.

For clock recovery purposes, the data receiver sampling voltages in the middle of the UI, at an ideal time which is half-UI away from time 12, can only discriminate voltages at one of three (3) thresholds, i.e. a high threshold 14 of +2 volts, a middle threshold 16 of 0 volt, and a low threshold 18 of −2 volts. In the case, for example, of a transition between D[n−1] equal to (1,1) and D[n] equal to (0,1), the voltage at the ideal time 12 is about +1 volt, which is not close to any one of the thresholds 14, 16 and 18. Comparing that +1 volt value to the thresholds 14, 16 and 18 at the ideal time 12 provides no information on a phase alignment between the recovered clock and the clock signal.

For those reasons, the only transitions that the data receiver may use in FIG. 1b for clock recovery those shown in Table I.

TABLE 1

| D[n − 1] | D[n] |
| --- | --- |
| (0, 0) | (0, 1) |
| (0, 0) | (1, 1) |
| (0, 1) | (0, 0) |
| (0, 1) | (1, 0) |
| (1, 0) | (0, 1) |
| (1, 0) | (1, 1) |
| (1, 1) | (0, 0) |
| (1, 1) | (1, 0) |

Hence, although the transition density is 75% when quaternary symbols are used, the density of transitions that the data receiver may use for clock recovery is only 50% because only those transitions identified in Table I are substantially at one of the thresholds 14, 16 or 18 at the ideal time 12. The clock recovery bandwidth is the same for in the case of the binary symbols of FIG. 1a and quaternary symbols of FIG. 1b when the data receiver uses three (3) voltage thresholds.

The transition between consecutive UIs as shown on FIG. 1b assumes an ideal phase alignment of a recovered clock with the clock signal. If the recovered clock is early or late, symbol voltages of the data samples D[n−1] and D[n] are not evaluated at the center of the UIs and errors may occur in the decoding of the data samples. For that reason, the data receiver attempts to properly and rapidly align the recovered clock with the clock signal of the received 4-PAM signal.

Figure 2:
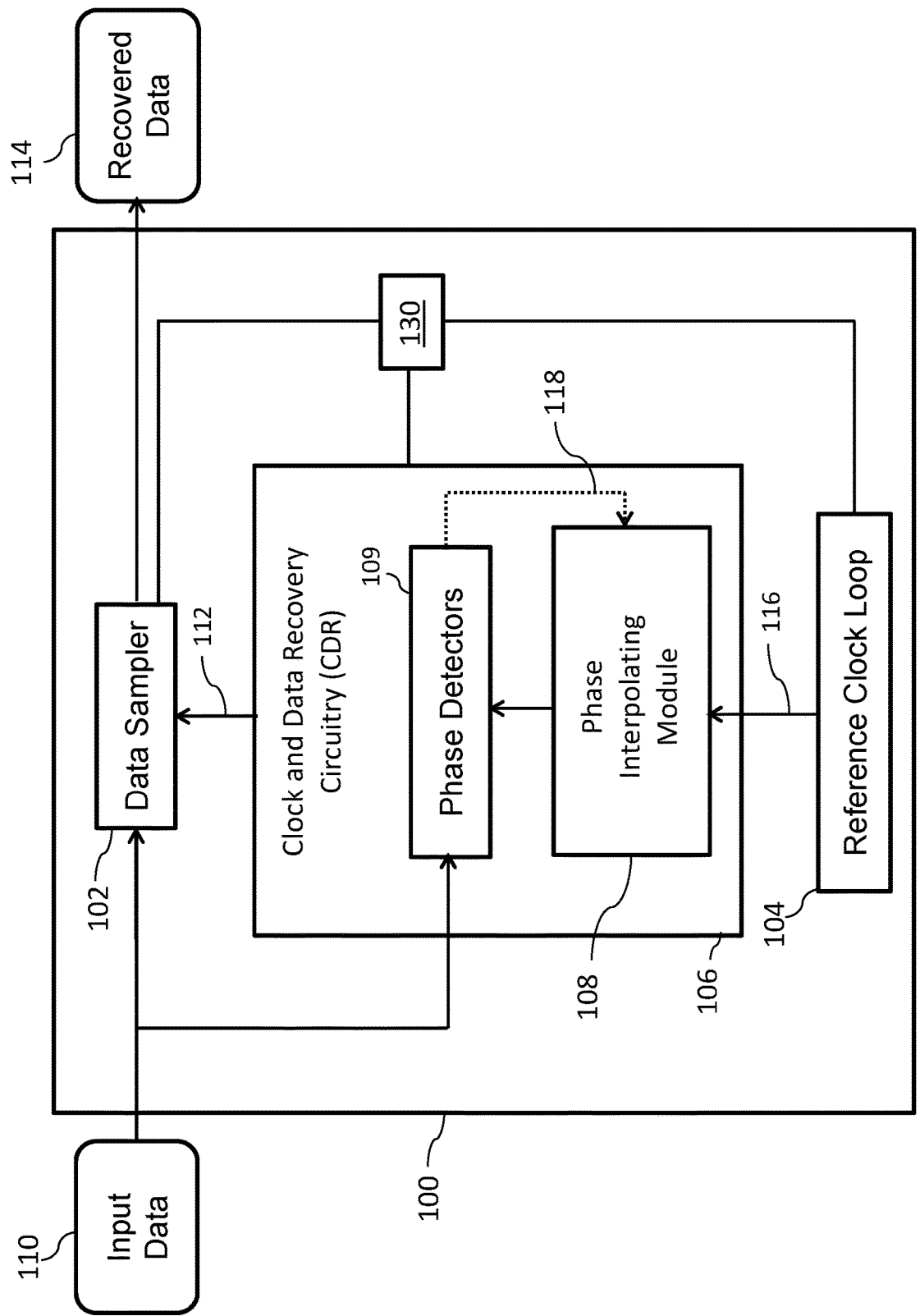
FIG. 2 is a block diagram of a data receiver according to an embodiment of the present technology.

With reference to FIG. 2, a block diagram of a data receiver 100 is shown. In this embodiment, the data receiver 100 comprises a data sampler 102, a reference clock loop 104, and a clock and data recovery (CDR) circuit 106 including a phase interpolating module 108. As will be described in greater details herein below, the phase interpolating module 108 may comprise a plurality of phase interpolators. The data receiver 100 can be implemented as a stand-alone chip, a system-on-chip (SOC), or larger electronic system. The data receiver 100 can also be representative of similar systems in a variety of environments and applications.

In this embodiment, the data receiver 100 receives an input data stream 110 from a transmitter (not shown). More specifically, a data sampler 102 of the data receiver 100 receives the input data stream 110 and executes a sampling thereof according to a timing and phase attributes of a sampling clock 112 to produce recovered data 114. The sampling clock 112 can comprise more than one signal (e.g., data clock and edge clock) depending on the design requirements of the data sampler 102. The sampling clock 112 is generated by the CDR circuit 106 based on multiple reference clocks 116 having varying phases and produced by the reference clock loop 104.

The phase interpolating module 108 may generate and control the timing and phase of the sampling clock 112 required for an accurate sampling and recovery of the input data stream 110. The phase interpolating module 108 accomplishes this, in part, by controlled interpolation of the phases of the reference clocks 116 provided by the reference clock loop 104. The phase interpolating module 108 may also use various feedback signals 118 to provide the sampling clock 112 (i.e. to recover the clock signal of the input data stream 110). The feedback signals 118 may originate or derive from the CDR circuit 106. In this embodiment, the CDR circuit 106 comprises phase detectors 109 that may access and sense the phase of the input data stream 110 and the phase of the sampling clock 112. The CDR circuit 106 may further generate the feedback signals 118 to adjust the phase codes of PIs of the Phase interpolating module 108 in response to phase errors (i.e. misalignment) between the phase of the input data stream 110 and the phase of the sampling clock 112, until the phase error is zeroed or at least under a given threshold.

Figure 3:
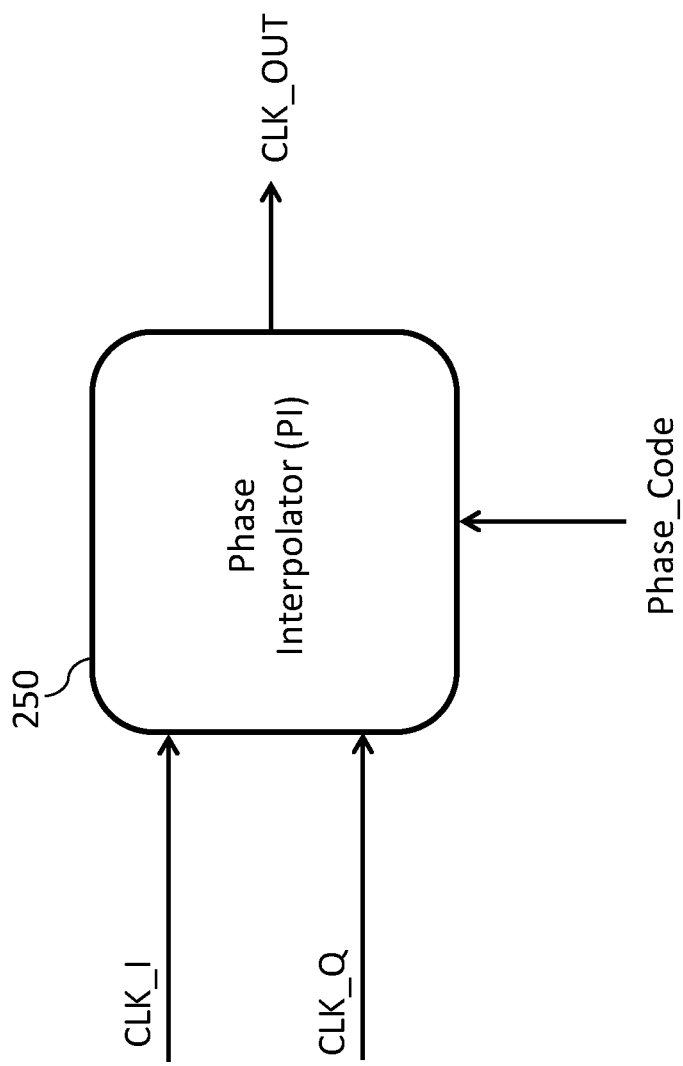
FIG. 3 is a simplified block diagram of a phase interpolator according to an embodiment of the present technology.

FIG. 3 a block diagram of a phase interpolator 250. The PI 250 or a plurality of PIs 250 may be comprised in phase interpolating module 108. In this embodiment, the PI 250 receives two input clock signals CLK_I and CLK_Q, which are 90 degrees apart (i.e. a phase shift between the two input clock signals CLK_I and CLK_Q), a phase code Phase_Code, and produces an output clock signal CLK_OUT whose phase is between phases of the two input clock signals CLK_I and CLK_Q. Other values of the phase shift between the two input clock signals CLK_I and CLK_Q are contemplated in alternative embodiments. The phase code Phase_Code is a value that allows the PI 250 to associate different weights to the two input clock signals CLK_I and CLK_Q such that the phase of the output clock signal CLK_OUT may be set anywhere between the phases of the two input clock signals CLK_I and CLK_Q.

In some instances, the PI 250 may receive more than two input clock signals that are associated with different weights based on the phase code to generate the output clock signal. For example, the PI 250 may receive four input signals clocks CLK0, CLK90, CLK180 and CLK270 with the input clock signal CLK90 shifted by +90 degrees with respect to the input clock signal CLK0, the input clock signal CLK180 shifted by +90 degrees with respect to the input clock signal CLK90, and the input clock signal CLK270 shifted by +90 degrees with respect to the input clock signal CLK180. As such, the phase of the output clock signal CLK_OUT may be set anywhere between 0° and 360°. It can be thus said that the PI 250 can "fully rotate".

The adjustment of phases across a phase range 208 (FIG. 5) of the PI 250 may have poor linearity and may be limited in overall phase adjustment range. For example, for a CMOS PI 250, high speed performances may be degraded further if it is scaled to precise phase adjustment resolution for improved PI linearity. Comparing CML and CMOS PIs, the former has better performances, notably in terms of linearity, and require larger areas than CMOS PIs.

Figure 4:
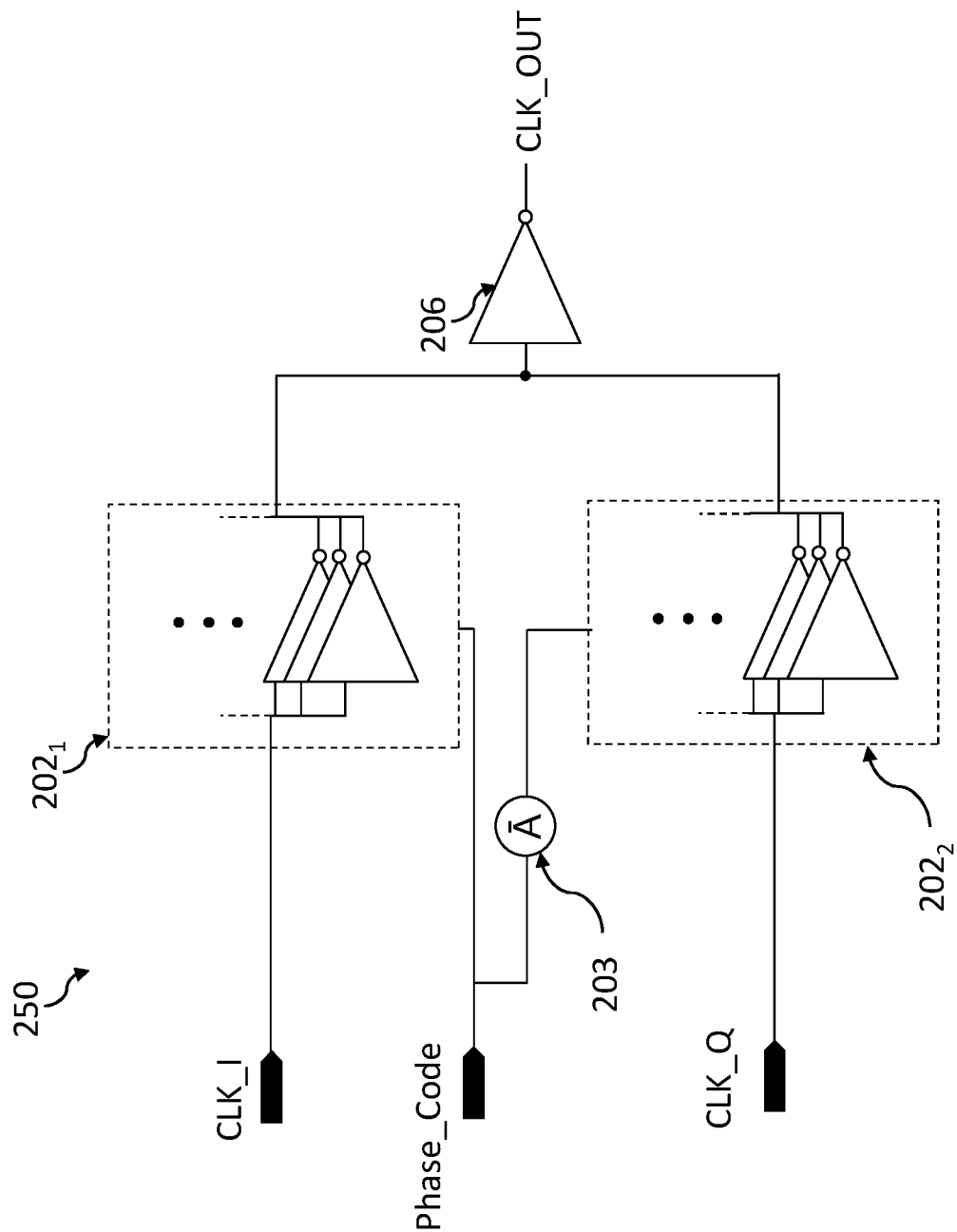
FIG. 4 is a detailed block diagram of the phase interpolator of FIG. 3.

FIG. 4 is a diagram the phase interpolator 250. As an option, one or more instances of the phase interpolator 250 or any aspect thereof may be implemented in the context of the architecture and functionality of the embodiments described herein. The phase interpolator 250 or any aspect thereof may be implemented in any desired environment. With respect to FIG. 4, the phase interpolator 250 comprises a first selectable clock buffer set $202_1$, a second selectable clock buffer set $202_2$, and an output clock buffer 206. The first clock buffer set $202_1$ receives the input signal CLK_I at each buffer input of the set $202_1$, the input signal CLK_I having a first phase. The second clock buffer set $202_2$ receives the input signal CLK_Q at each buffer input of the set $202_2$, the input signal CLK_Q having a second phase. The outputs of each buffer in the first clock buffer set $202_1$ and the second clock buffer set $202_2$ are summed or mixed at the output clock buffer 206 to provide the output clock signal CLK_OUT having an interpolated phase.

More specifically, each buffer in the selectable clock buffer sets $202_1$ and $202_2$ may be controlled (e.g., enabled or disabled) by the phase code Phase_Code comprising a separate control signal for each buffer in the set $202_1$ and a corresponding complement control signal for each buffer in the set $202_2$, the complement control signals being generated via a code inverter 203. For example and without limitation, the clock buffer sets $202_1$ and $202_2$ may each have sixteen buffers and the phase code Phase_Code may comprise sixteen corresponding digital signals to control the first selectable clock buffer set $202_1$, the complement of those sixteen digital signals controlling the second clock buffer set $202_2$. By selecting various combinations of control signals, or "weighting" the selectable clock buffer sets, the phase interpolator 250 may produce the output clock signal CLK_OUT having a phase between the phase of the input signal CLK_I and the phase of the input signal CLK_Q. A second output clock signal (not shown) may be generated based on the output clock signal CLK_OUT, by tapping the output clock signal CLK_OUT into an inverter such that the second output clock signal is in phase opposition with the output clock signal CLK_OUT.

In this embodiment, the phase code may be set at a pre-determined value. In this scenario, the phase interpolator 250 is said to be "static". On the opposite, the phase code may be adjusted by the CDR circuit 106 at a pre-determined rate and/or in a continuous manner based on, for example, the feedback signals 118 provided by the CDR circuit 106. For example, the phase code may be adjusted if determination is made by the CDR circuit 106 that the sampling clock 112 has a frequency lower or higher than the frequency of the input data stream 110.

Figure 5:
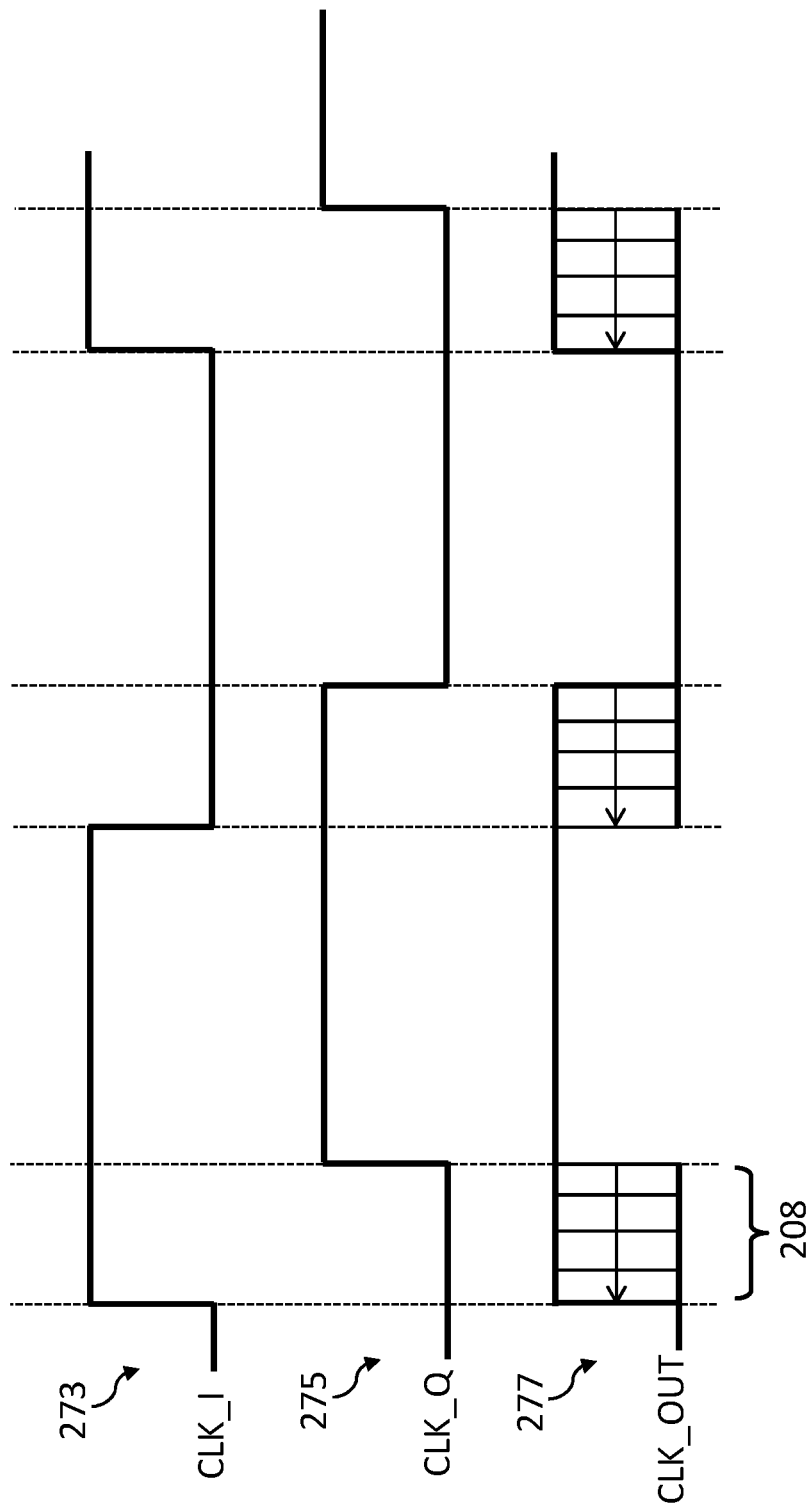
FIG. 5 depicts selected waveforms of the phase interpolator of FIG. 3.

FIG. 5 depicts selected waveforms of the phase interpolator 250. The selected waveforms comprise timing diagrams 273, 275 and 277 for the input signal CLK_I, the input signal CLK_Q, and the output clock signal CLK_OUT. As different combinations or weighting of the first and second selectable clock buffer sets $202_1$ and $202_2$ may be selected based on the phase code Phase_Code, the phase of the output clock signal CLK_OUT may be set across a phase range 208 from the phase of the input signal CLK_I to the phase of the input signal CLK_Q.

Figure 6:
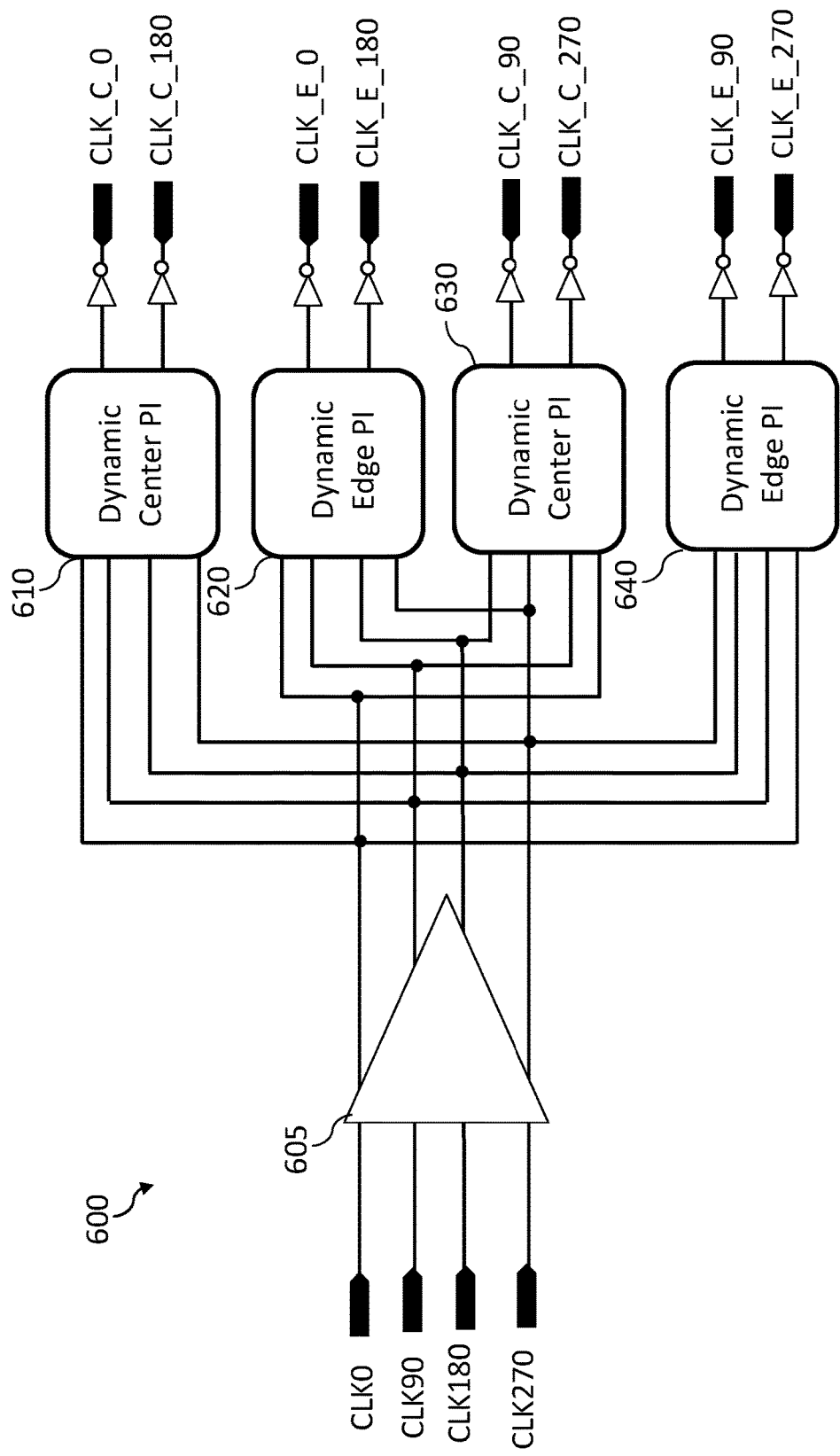
FIG. 6 is a schematic of a phase interpolating module of the prior art.

FIG. 6 is a schematic of a quarter-rate phase interpolating module 600 from the prior art. The quarter-rate phase interpolating module 600 typically generates four clock phases to recover the clock center and four clock phases to recover the edge clock. In the context of this description, the clock phases, or "clock signals", used to recover the clock center are referred to as "center clocks", and the clock phases, or "clock signals", used to recover the clock edge are referred to as "edge clocks".

The quarter-rate phase interpolating module 600 comprises two dynamic center PIs 610 and 630 for generating the four center clocks CLK_C_0, CLK_C_90, CLK_C_180 and CLK_C_270, and two dynamic edge PIs 620 and 640 for generating the four edge clocks CLK_E_0, CLK_E_90, CLK_E_180 and CLK_E_270. As such, the quarter-rate phase interpolating module 600 conventionally comprises four dynamic PIs, where phase codes of each PI are updated in a continuous manner to track the phase and the frequency offset between the input data stream and the center and edge clock signals. Therefore, highly linear dynamic PIs are conventionally used for both center and edge clock generation, as depicted on FIG. 6.

More specifically, the quarter-rate phase interpolating module 600 receives four input clock signals CLK0, CLK90, CLK180 and CLK270 from a phase-locked loop (PLL) (not shown) that may be directed through an input buffer 605, such that each of the dynamic center PIs 610, 620, 630 and 640 receives the input clock signals CLK0, CLK90, CLK180 and CLK270 as inputs. The four input signals clocks CLK0, CLK90, CLK180 and CLK270 may be generated from a same main input clock signal (e.g. the input clock signal CLK0) such that they all have a same frequency. More specifically, as indicated by their names in this illustrative example, the input clock signal CLK90 is shifted by +90 degrees with respect to the input clock signal CLK0, the input clock signal CLK180 is shifted by +90 degrees with respect to the input clock signal CLK90, and the input clock signal CLK270 is shifted by +90 degrees with respect to the input clock signal CLK180.

As such, the dynamic center PI 610 generates the center clock signals CLK_C_0 and CLK_C_180 based on the input clock signals CLK0, CLK90, such that a phase of the center clock signal CLK_C_0 is set between phases of the input clock signals CLK0, CLK90, the center clock signal CLK_C_180 being in phase opposition with the center clock signal CLK_C_0. Similarly, the dynamic center PI 630 generates the center clock signals CLK_C_90 and CLK_C_270 based on the input clock signals CLK180, CLK270, such that a phase of the center clock signal CLK_C_90 is set between phases of the input clock signals CLK180, CLK270, the center clock signal CLK_C_270 being in phase opposition with the center clock signal CLK_C_90.

Likewise, the dynamic edge PI 620 generates the edge clock signals CLK_E_0 and CLK_E_180 based on the input clock signals CLK0, CLK90, such that a phase of the edge clock signal CLK_E_0 is set between phases of the input clock signals CLK0, CLK90, the edge clock signal CLK_E_180 being in phase opposition with the edge clock signal CLK_E_0. Similarly, the dynamic edge PI 640 generates the edge clock signals CLK_E_90 and CLK_E_270 based on the input clock signals CLK180, CLK270, such that a phase of the edge clock signal CLK_E_90 is set between phases of the input clock signals CLK180, CLK270, the edge clock signal CLK_E_270 being in phase opposition with the edge clock signal CLK_E_90.

As described herein above, the quarter-rate phase interpolating module 600 conventionally relies on using four highly linear dynamic PIs (e.g. CML PIs) for generation of both center and edge clock signals. This configuration requires significant area and power consumption. One aspect of the present technology is to provide a method for generating an edge clock signal of a sampling clock signal for sampling a data stream. In one embodiment, the generation of said edge clock signal is made by a static PI (e.g. a CMOS PI), instead of a dynamic PI as illustrated in FIG. 6, which can help in drastically reducing the required area and power consumption of a system that performs said method.

Figure 7:
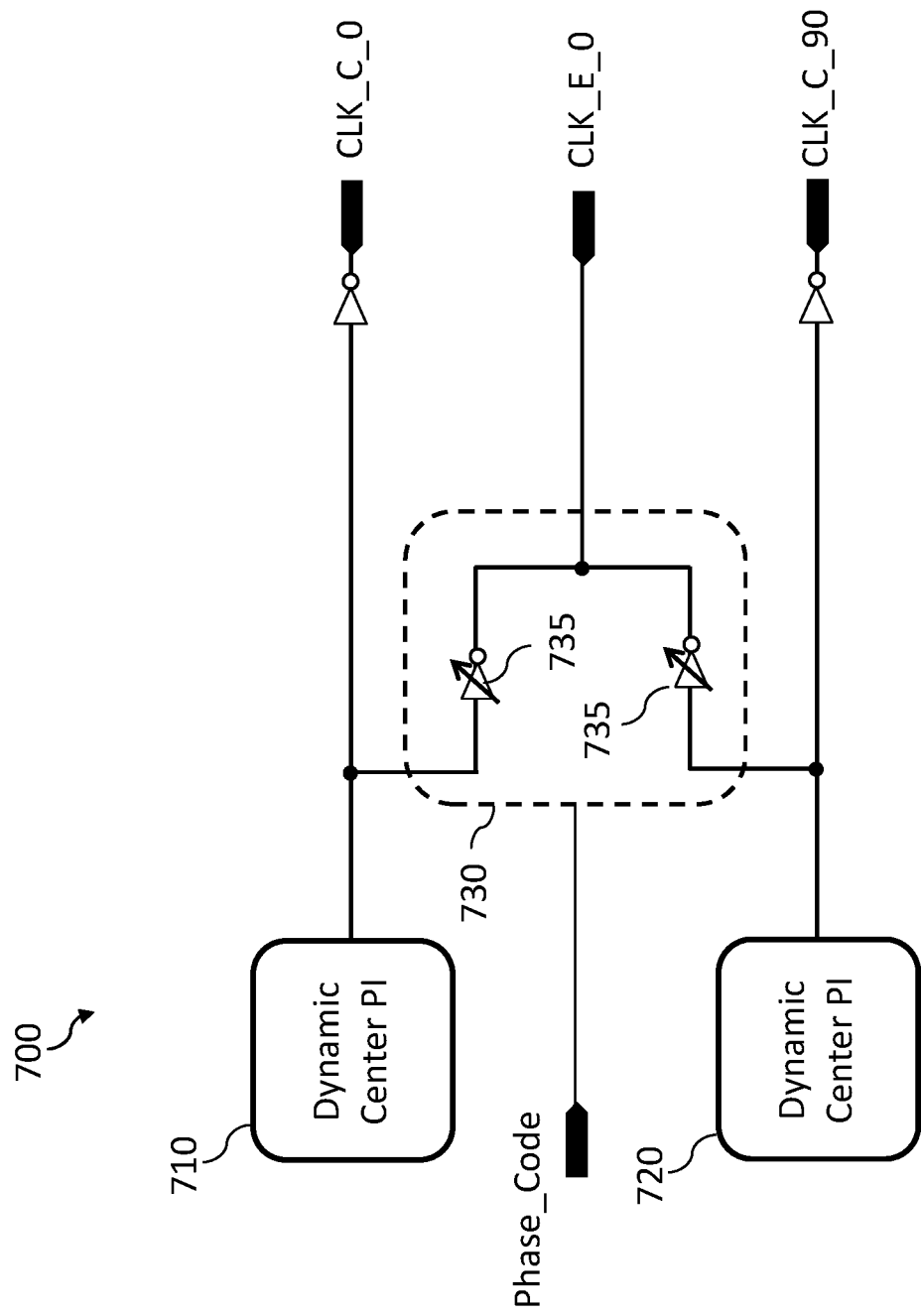
FIG. 7 is a schematic of a phase interpolating module of the data receiver of FIG. 2 according to one embodiment of the present technology.

Broadly speaking, in one embodiment of the present technology, the phase interpolating module 108 may comprise one or more dynamic PIs for generation of center clock signals and one or more static PIs for generation of an edge clock signal based on the center clock signals. FIG. 7 is a diagram of an arrangement 700 of phase interpolators for generation of an edge clock signal based on center clock signals in accordance with an embodiment of the present technology.

In this embodiment, the arrangement 700 comprises two dynamic PIs 710 and 720 receiving reference clock signals (not shown) to respectively generate the center clock signal CLK_C_0 and the center clock signal CLK_C_90. In this embodiment, the two dynamic PIs 710 and 720 may also generate the center clock signal CLK_C_180 and the center clock signal CLK_C_270 respectively, that are not shown for simplicity of the FIG. 7. The arrangement 700 also comprises a PI 730 receiving the center clock signals CLK_C_0 and CLK_C_90 as inputs and generating the edge clock signals CLK_E_0. In this particular implementation, the PI 730 comprises two variable strength inverters 735, whose strength may be adjusted based on a received phase code as described in FIGS. 3 and 4. In this embodiment, the strength of the variable strength inverters 735 may be set on a pre-determined value by a pre-determined phase code such that the PI 730 is a static PI 730. The pre-determined phase code may be, for example, set at a calibration of the static PI 730 before usage thereof. Indeed, as center clock signals CLK_C_0 and CLK_C_90 are used to sample the data stream 110 at the center of the UIs, the edge clock signals CLK_E_0 may be set in the middle of the center clock signals CLK_C_0 and CLK_C_90 to be used to sample edges of the UIs of the data stream 110. Therefore, the dynamic PIs 710, 720 may continuously rotate to track the potential frequency offset to generate the two center clock signals CLK_C_0 and CLK_C_90 while the static PI 730 generates the edge clock signals CLK_E_0 whose position between the two center clock signals CLK_C_0 and CLK_C_90 is predetermined.

CML PIs conventionally occupy a larger area within data receiver chips and consume a higher power compared to CMOS PIs. Indeed, a relatively large area may be required for implementing low-offset current DACs of CML PIs. Moreover, a CML to CMOS conversion can be required at an output of CML PIs as systems for sampling the data stream conventionally require CMOS clock signals. Indeed, while highly linear relatively to CMOS PIs, CML PIs have poor compatibility with most recent circuit designs that are predominantly of the CMOS type. For these reasons, a CML PI is typically chosen when the CDR has to track a frequency offset, while a CMOS PI is chosen in applications where no frequency offset is present. As such, in this non-limiting embodiment, the dynamic PIs 710, 720 are CML PIs and the static PI 730 is a CMOS PI. As such, the static PI 730 used for generation of the edge clock signals CLK_E_0 may have relatively lower performance requirements with respect to the dynamic PIs 710, 720, thereby reducing a cost of the generation of edge clock signals.

In at least one embodiment, the pre-determined phase code of the static PI 730 may cause the phase of the edge clock signals CLK_E_0 to be centered with respect to phases of the center clock signals CLK_C_0 and CLK_C_90. In other words, the pre-determined phase code may cause the variable strength inverter to have a same strength, thereby associating an equal weight to the center clock signals CLK_C_0 and CLK_C_90.

Figure 8:
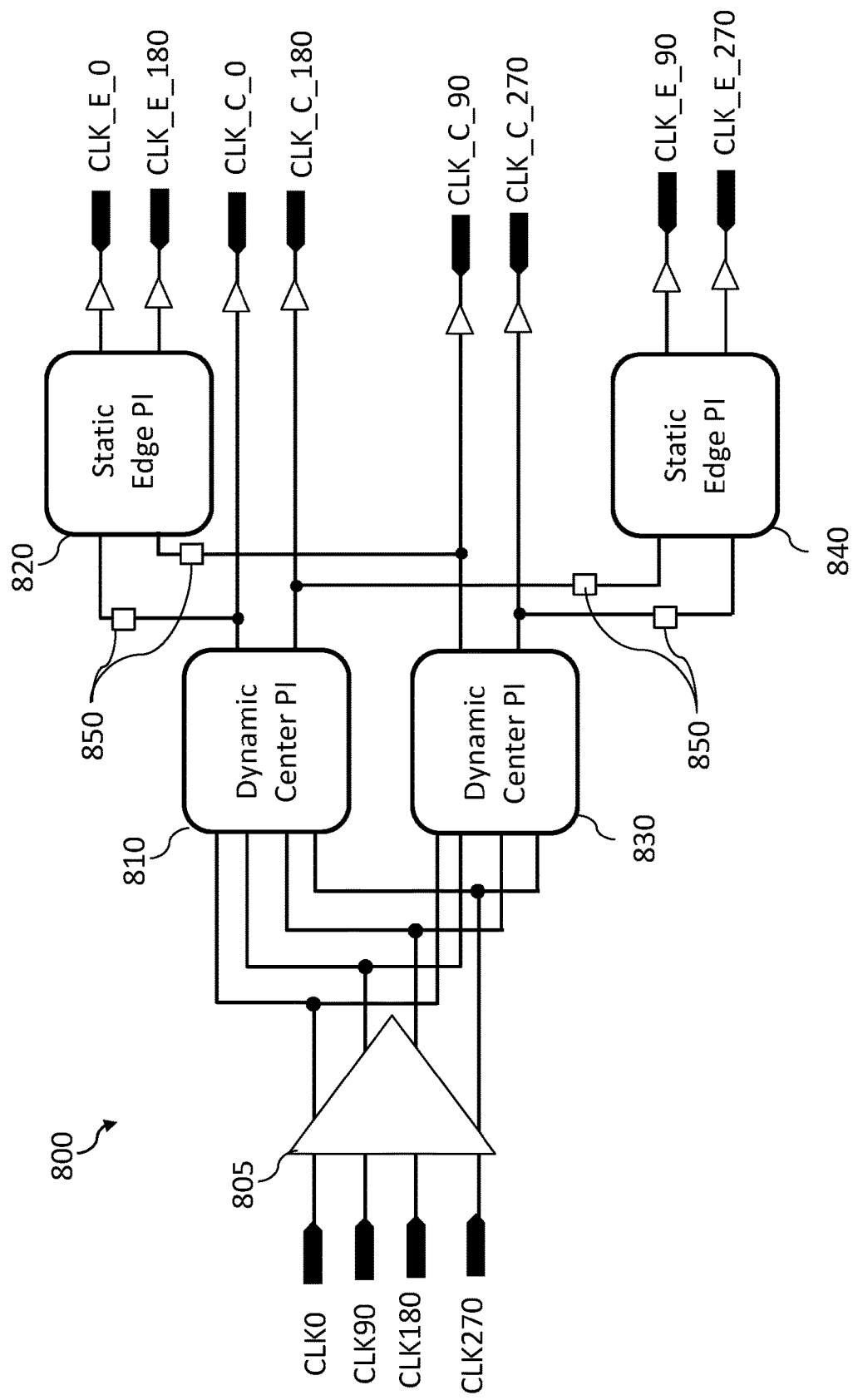
FIG. 8 is a schematic of a phase interpolating module of the data receiver of FIG. 2 according to another embodiment of the present technology.

FIG. 8 is a diagram of an arrangement 800 of phase interpolators according to an embodiment of the present technology. In this embodiment, the arrangement 800 is implemented in the phase interpolating module 108 of the data receiver 100.

In this embodiment, the arrangement 800 comprises two dynamic PIs 810 and 830 receiving reference clock signals CLK0, CLK90, CLK180 and CLK270 to respectively generate the center clock signals CLK_C_0, CLK_C_180 and the center clock signals CLK_C_90, CLK_C_270. In this embodiment, the reference clock signals CLK0, CLK90, CLK180 and CLK270 are generated by the reference clock loop 104 of the data receiver 100 and are referred to as "reference clocks 116" on FIG. 1. In this embodiment, the reference clock signal CLK90 is generated by reference clock loop 104 such that it is shifted by +90 degrees with respect to the reference clock signal CLK0. Similarly, the reference clock signal CLK180 is shifted by +90 degrees with respect to the reference clock signal CLK90, and the reference clock signal CLK270 is shifted by +90 degrees with respect to the reference clock signal CLK180. As such, the phase of the center clock signals CLK_C_0 and CLK_C_90 may be set anywhere between 0° and 360°. The center clock signals CLK_C_180 and CLK_C_270 may be generated based on an inversion of the center clock signals CLK_C_0 and CLK_C_90 respectively. It can be thus said that the two dynamic PIs 810 and 830 can "fully rotate" as they receive the four reference clock signals CLK0, CLK90, CLK180 and CLK270 as inputs. In a non-limiting embodiment, the two dynamic PIs 810 and 830 are CML PIs.

In this embodiment, the reference clock loop 104 comprises a phase-locked loop (PLL) (not shown) in collaboration with an integrated voltage-controlled oscillator (VCO) (not shown) to generate the four reference clock signals CLK0, CLK90, CLK180 and CLK270 at a predetermined frequency. More specifically, in this embodiment, the PLL-VCO may generate two of the four reference clock signals and the reference clock loop 104 may comprise a divider (not shown) to generate the other two reference clock signals. In this embodiment, the four reference clock signals CLK0, CLK90, CLK180 and CLK270 are directed through an input buffer 805 prior being direct to the two dynamic PIs 810 and 830.

The arrangement 800 also comprises two static PIs 820, 840 that respectively generate the edge clock signals CLK_E_0, CLK_E_180 and the edge clock signals CLK_E_90, CLK_E_270. More specifically, the static PI 820 receives the center clock signals CLK_C_0 and CLK_C_90 as inputs and generates the edge clock signal CLK_E_0 as described for example in the illustrative implementation of FIG. 7. The static PI 820 further generates the edge clock signal CLK_E_180 based on an inversion of the edge clock signal CLK_E_0. Similarly, the static PI 840 receives the center clock signals CLK_C_180 and CLK_C_270 as inputs and generates the edge clock signal CLK_E_90 as described for example in the illustrative implementation of FIG. 7. The static PI 840 further generates the edge clock signal CLK_E_270 based on an inversion of the edge clock signal CLK_E_90.

In this non-limiting embodiment, the two static PIs 820 and 840 may be CMOS PIs. The arrangement 800 may thus comprise CML-to-CMOS converter 850 at inputs of the two static PIs 820 and 840 such that the center clock signals CLK_C_0, CLK_C_180, CLK_C_90 and CLK_C_270 are converted from CML clock signals to CMOS clock signals to be processed by the two static PIs 820 and 840.

In at least some embodiments, the arrangement 800 also comprises an eye-opening monitor (EOM) (not shown) that generates two phases of an eye monitor clock based on the four reference clock signals CLK0, CLK90, CLK180 and CLK270. The eye monitor PI may be used for adaptation, calibration and plotting an eye diagram of the input data stream 110.

In operation, the phase codes of the two dynamic PIs 810 and 830 may be continuously updated such that phases of the four center clock signals may be adjusted to track the frequency and phase of the data stream 110 and the frequency and phase of the reference clock signals 116. The edge clock signals are thus generated from the center clock signals such that adjusting the phases of the center clock signals causes an adjustment of the phases of the edge clock signals. As such, the edge clock signals may be generated by the static PIs so that power consumption and required area for edge clock signals generation may be reduced.

As such, the center clock signals CLK_C_0, CLK_C_180, CLK_C_90 and CLK_C_270 and the edge clock signals CLK_E_0, CLK_E_180, CLK_E_90, and CLK_E_270 form the sampling clock 112 (FIG. 2) that is used by the data sampler 102 of the data receiver 100 to sample the data stream 110.

Figure 9:
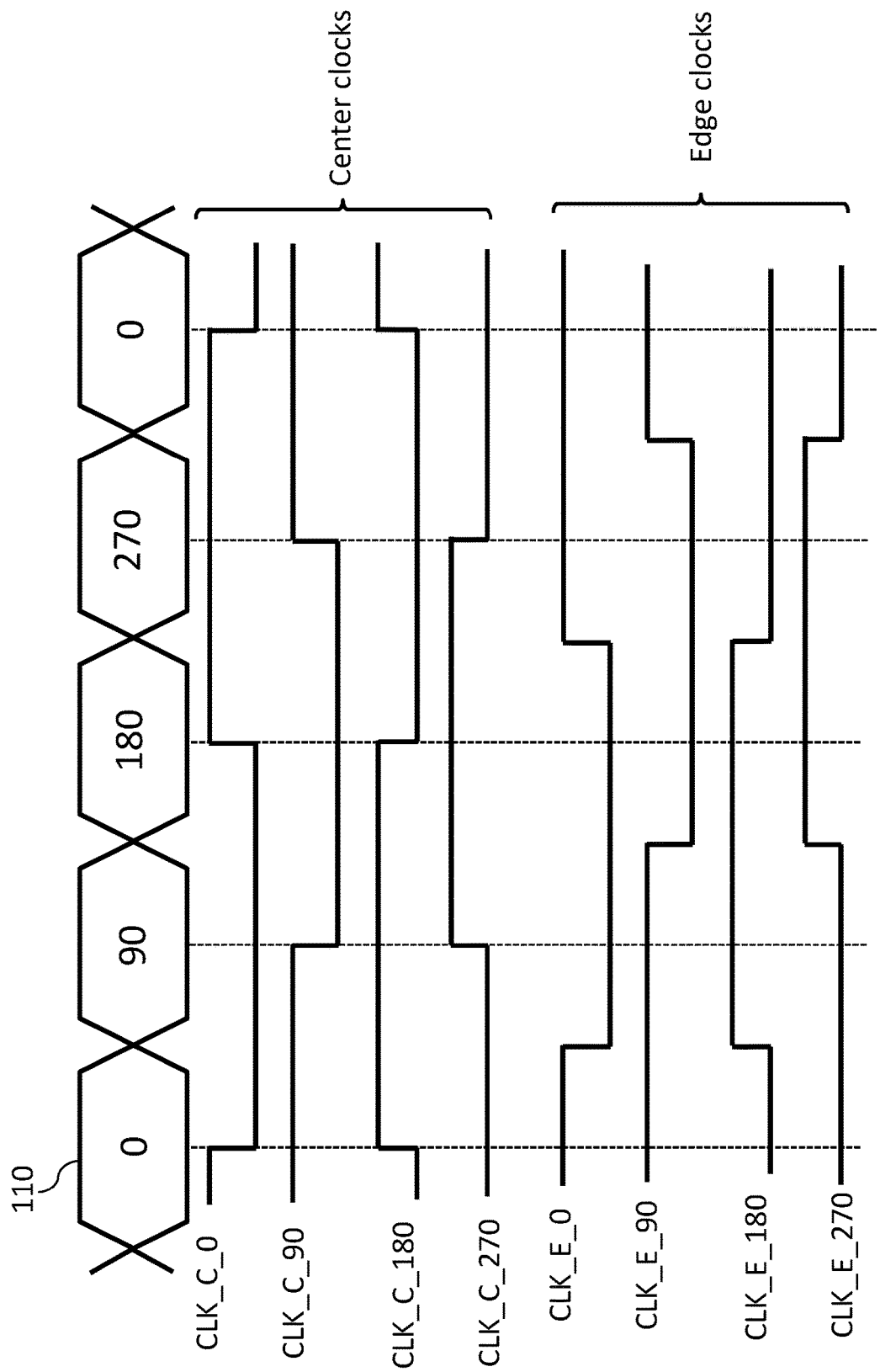
FIG. 9 depicts waveforms of center and edge clock signals generated by the phase interpolating module of FIG. 8.

More specifically, in this embodiment and with respect to FIG. 9, rising edges the four center clock signals CLK_C_0, CLK_C_180, CLK_C_90 and CLK_C_270 are used to sample the data stream 110 at centers of the UIs, and rising edges the four edge clock signals CLK_E_0, CLK_E_180, CLK_E_90 and CLK_E_270 are used to sample the data stream 110 at edges of the UIs. In this embodiment, a period of the center and edge clock signal is equal to a duration of four UI, as the arrangement 800 is a quarter rate phase interpolating module.

It should be understood that other arrangements of dynamic and static PIs are contemplated in alternative embodiments of the present technology. For instance, a half rate phase interpolating module may be formed using one dynamic PI (e.g. the dynamic PI 810) generating two center clock signals and one static PI (e.g. the static PI 820) generating two edge clock signals based on the two center clock signals. In this instance, a period of the reference clocks may be shorter such that a period of the two center clock signals and two edge clock signals is equal to a duration of two UIs.

Figure 10:
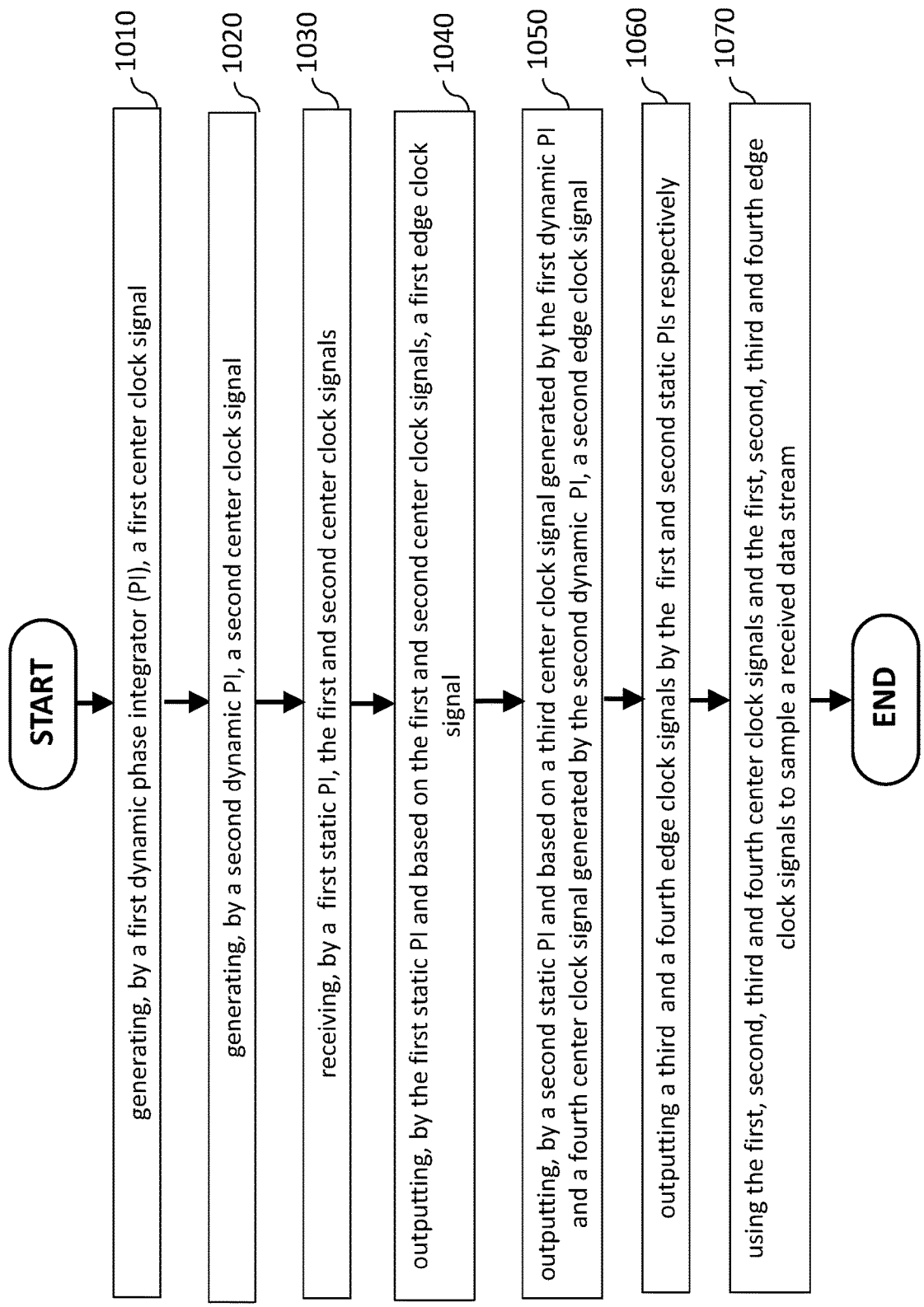
FIG. 10 illustrates a flow diagram showing operations of a method for generating an edge clock signal of a sampling clock signal for sampling a data stream in accordance with an embodiment of the present technology.

With reference to FIG. 10, a method 1000 for generating an edge clock signal of a sampling clock signal for sampling the data stream 110 according to some implementations of the present technology is illustrated in the form of a flowchart. In one or more aspects, the method 1000 is performed by a processor of the data receiver 100, such as controller 130, or a processor communicably connected thereto. In some implementations, one of more operations of the method 1000 could be implemented, whole or in part, by another computer-implemented device. It is also contemplated that the method 1000 or one or more operation thereof may be embodied in computer-executable instructions that are stored in a computer-readable medium, such as a non-transitory mass storage device, loaded into memory and executed by a processor, such as the controller 130. Some operations or portions of operations in the flow diagram may be possibly being executed concurrently, omitted or changed in order.

The method 1000 begins with, at operation 1010, generating, by the dynamic PI 810, the center clock signal CLK_C_0. In this embodiment, the dynamic PI 810 receives the four reference clock signals CLK0, CLK90, CLK180 and CLK270 from the reference clock loop 104 as input to generate the center clock signal CLK_C_0, wherein CLK90 has a +90° phase shift relatively to CLK0, CLK180 has a +90° phase shift relatively to CLK90, and CLK270 has a +90° phase shift relatively to CLK180. As such, the dynamic PI 810 can fully rotate (i.e. the phase of the center clock signal CLK_C_0 may be set anywhere between 0° and 360°.

In this embodiment, the dynamic PI 810 may be a CML PI and receive a phase code from, for example, the controller 130 that may be continuously updated such that the phase of the center clock signal CLK_C_0 is adjusted and its frequency locked to a frequency of the data stream 110. More specifically, the phase code may allow the dynamic PI 810 to associate a continuously updated weight to each of the four reference clock signals CLK0, CLK90, CLK180 and CLK270 to set a phase of the center clock signal CLK_C_0. In this embodiment, the phase code may be updated based on information comprised in the feedback signal 118 provided by the phase detectors 109.

The method 1000 continues with, at operation 1020, generating, by the dynamic PI 830, the center clock signal CLK_C_90. In this embodiment, the dynamic PI 830 receives the four reference clock signals CLK0, CLK90, CLK180 and CLK270 from the reference clock loop 104 as input to generate the center clock signal CLK_C_90. As such, the dynamic PI 830 can fully rotate (i.e. the phase of the center clock signal CLK_C_90 may be set anywhere between 0° and 360°). In this embodiment, the center clock signals CLK_C_0 and CLK_C_90 are generated such that the center clock signal CLK_C_90 has a +90° phase shift relatively to the center clock signal CLK_C_0.

In this embodiment, the dynamic PI 830 is a CML PI and receives a phase code from, for example, the controller 130 that may be continuously updated such that the phase of the center clock signal CLK_C_90 is adjusted and its frequency locked to a frequency of the data stream 110. More specifically, the phase code may allow the dynamic PI 830 to associate a continuously updated weight to each of the four reference clock signals CLK0, CLK90, CLK180 and CLK270 to set a phase of the center clock signal CLK_C_90.

The method 1000 continues with, at operation 1030, receiving, by the static PI 820, the center clock signals CLK_C_0 and CLK_C_90.

In this embodiment, the static PI 820 may be a CMOS PI and the center clock signals CLK_C_0 and CLK_C_90 may be converted into CMOS clock signals by the CML-to-CMOS converters 850 before being received by the static PI 820.

In at least one embodiment, the method 1000 continues with, at operation 1040, outputting, by the static PI 820 and based on the first and second center clock signals, the edge clock signal CLK_E_0. In this embodiment, the phase code of the static PI 820 may be pre-determined such that a relative position of the phase of the edge clock signal CLK_E_0 between phases of the center clock signals CLK_C_0 and CLK_C_90 is pre-determined and, for example, set at a center between the center clock signals CLK_C_0 and CLK_C_90.

In at least one embodiment, the static PI 820 may comprise the first and second inverters 735 and receive the center clock signals CLK_C_0 and CLK_C_90 at the first and second inverters 735 respectively. The two signals outputted by the two inverters may further be combined to form the edge clock signal CLK_E_0.

In at least one embodiment, the method 1000 continues with, at operation 1050, outputting, by the dynamic PI 810, the center clock signal CLK_C_180 based, for example, an inversion of the center clock signal CLK_C_0 and generating, by the dynamic PI 830, the center clock signal CLK_C_270 based, for example, an inversion of the center clock signal CLK_C_90. As such, in this embodiment, the center clock signal CLK_C_270 has a +90° phase shift relatively to the center clock signal CLK_C_180.

The method may further comprise, in this embodiment, converting the center clock signals CLK_C_180 and CLK_C_270 from CML clock signals CMOS clock signals by the CML-to-CMOS converters 850 and transmitting said converted center clock signals CLK_C_180 and CLK_C_270 to the static PI 840 which is, in this embodiment, a CMOS PI. In this embodiment, the static PI 840 further generates the edge clock signal CLK_E_90. The static PI 820, 840 may receive a same phase code such that, for example, the edge clock signals CLK_E_0 and CLK_E_90 are in phase quadrature. Additionally, at operation 1060 the static PI 820, 840 may respectively generate the edge clock signals CLK_E_180 and CLK_E_270 based on inversions of the edge clock signals CLK_E_0 and CLK_E_90 respectively.

As such, the four center clock signals CLK_C_0, CLK_C_90, CLK_C_180 and CLK_C_270 and the edge clock signals CLK_C_0, CLK_C_90, CLK_C_180 and CLK_C_270 may form the sampling clock 112 used by the data sampler 102. In this embodiment, the method 1000 may further comprise, at operation 1070, sampling the data stream 110 based on the sampling clock 112, thereby generating the recovered data 114. In this embodiment, the phase code of the dynamic PIs 810, 830 may be updated based on information about a sampling of the data stream 110 provided by the feedback system 118.

Figure 11:
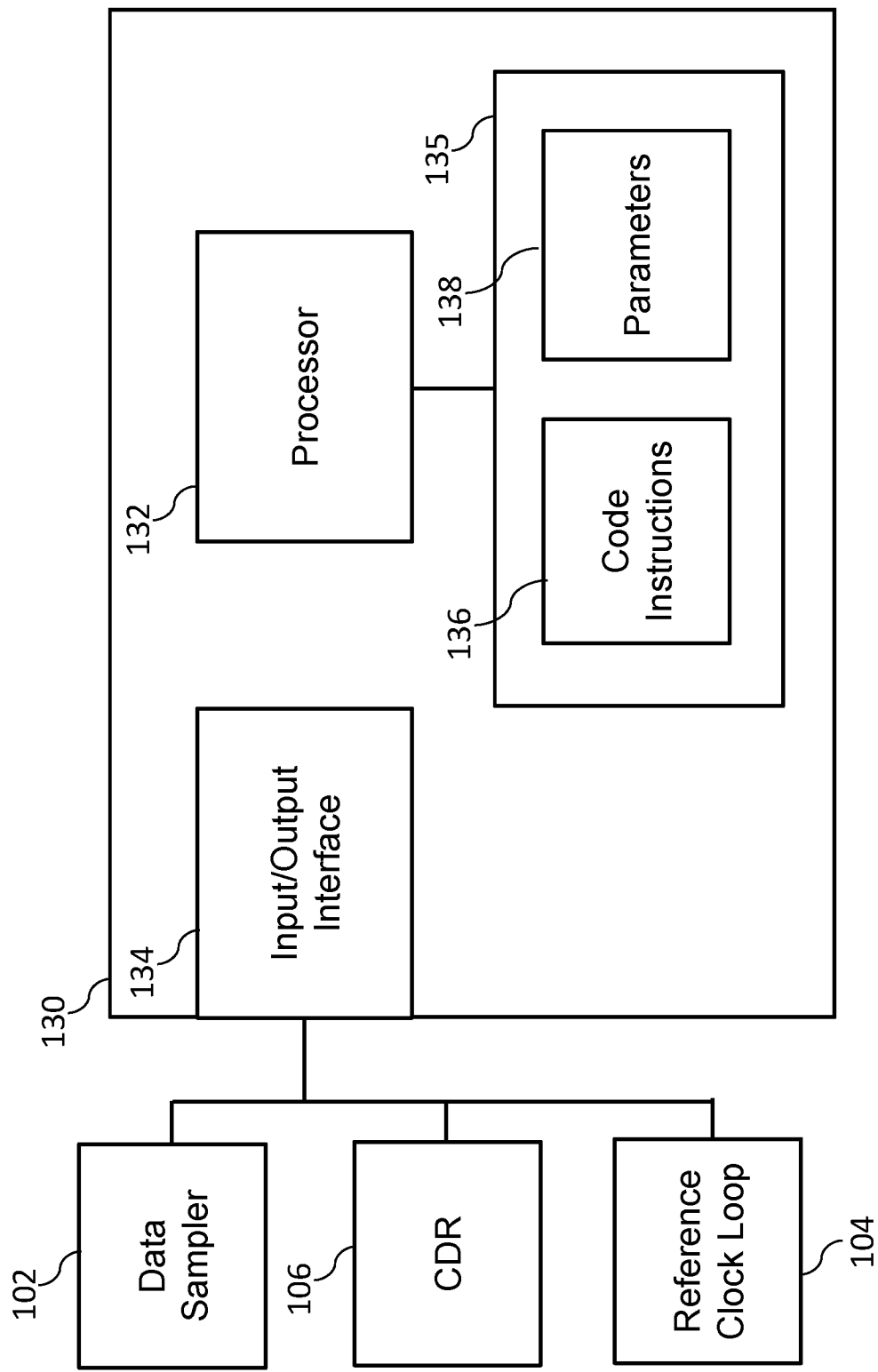
FIG. 11 is a block diagram of a controller in accordance with an embodiment of the present technology.

As an example, FIG. 11 is a schematic block diagram of the controller 130 of the data receiver 100 according to an embodiment of the present technology. The controller 130 comprises a processor or a plurality of cooperating processors (represented as a processor 132 for simplicity), a memory device or a plurality of memory devices (represented as a memory device 135 for simplicity), and an input/output interface 134 allowing the controller 130 to communicate with other components of the data receiver 100 and/or other components in remote communication with the data receiver 100. The processor 132 is operatively connected to the memory device 135 and to the input/output interface 134. The memory device 135 includes a storage for storing parameters 136, including for example and without limitation the above-mentioned pre-determined phase codes. The memory device 135 may comprise a non-transitory computer-readable medium for storing code instructions 138 that are executable by the processor 132 to allow the controller 130 to perform the various tasks allocated to the controller 130 in the method 1000.

The controller 130 is operatively connected, via the input/output interface 134, to the reference clock loop 104, the data sampler 102 and the CDR circuit 106 comprising the phase interpolating module 108. The controller 130 executes the instructions 136 stored in the memory device 135 to implement the various above-described functions that may be present in a particular embodiment. FIG. 11 as illustrated represents a non-limiting embodiment in which the controller 130 receives measurements from the data sampler 102 and controls the CDR circuit 106 accordingly. This particular embodiment is not meant to limit the present disclosure and is provided for illustration purposes.

It will be appreciated that at least some of the operations of the method 1000 may also be performed by computer programs, which may exist in a variety of forms, both active and inactive. As such, the computer programs may exist as software program(s) comprised of program instructions in source code, object code, executable code or other formats. Any of the above may be embodied on a computer readable medium, which include storage devices and signals, in compressed or uncompressed form. Representative computer readable storage devices include conventional computer system RAM (random access memory), ROM (read only memory), EPROM (erasable, programmable ROM), EEPROM (electrically erasable, programmable ROM), and magnetic or optical disks or tapes. Representative computer readable signals, whether modulated using a carrier or not, are signals that a computer system hosting or running the computer program may be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general.

It is to be understood that the operations and functionality of the described data receiver 100, its constituent components, and associated processes may be achieved by any one or more of hardware-based, software-based, and firmware-based elements. Such operational alternatives do not, in any way, limit the scope of the present disclosure.

It will be understood that, although the embodiments presented herein have been described with reference to specific features and structures, it is clear that various modifications and combinations may be made without departing from such disclosures. The specification and drawings are, accordingly, to be regarded simply as an illustration of the discussed implementations or embodiments and their principles as defined by the appended claims, and are contemplated to cover any and all modifications, variations, combinations or equivalents that fall within the scope of the present disclosure.

What is claimed is:

1. A clock recovery method comprising:
    receiving, by a first dynamic phase interpolator (PI), a plurality of reference clock signals including:
        a first reference clock signal,
        a second reference clock signal having a +90° phase shift with the first reference clock signal,
        a third reference clock signal having a +90° phase shift with the second reference clock signal, and
        a fourth reference clock signal having a +90° phase shift with the third reference clock signal;
    generating, by the first dynamic PI, a first center clock signal, generating of the first center clock comprising:
    receiving, by the first dynamic PI, a first phase code for weighting the first, second, third and fourth reference clock signals to adjust a phase of the first center clock signal;
        generating, by a second dynamic PI, a second center clock signal; and
        outputting, by a static PI, an edge clock signal based on the first and second center clock signals.

2. The method of claim 1, wherein outputting, by the static PI, the edge clock signal based on the first and second center clock signals comprises:
    receiving, by a first inverter of the static PI, the first center clock signal;
    receiving, by a second inverter of the static PI, the second center clock signal; and
    combining outputs of the first and second inverters.

3. The method of claim 1, wherein the first and second center clock signals are generated with a 90° phase shift.

4. The method of claim 1, wherein the first and second dynamic PIs are Current Mode Logic PIs.

5. The method of claim 1, wherein the static PI is a Complementary Metal Oxide Semiconductor PI.

6. The method of claim 1, further comprising adjusting, based on a feedback system, the first phase code received by the first dynamic PI.

7. The method of claim 1, wherein generating, by the second dynamic PI, the second center clock signal comprises:
    receiving, by the second dynamic PI:
    the first reference clock signal,
    the second reference clock signal having a +90° phase shift with the first reference clock signal,
    the third reference clock signal having a +90° phase shift with the second reference clock signal, and
    the fourth reference clock signal having a +90° phase shift with the third reference clock signal.

8. The method of claim 7, wherein generating, by the second dynamic PI, the second center clock signal comprises receiving a second phase code for weighting the first, second, third and fourth reference clock signals to adjust a phase of the first center clock signal.

9. The method of claim 1, wherein the static PI is a first static PI and the edge clock signal is a first edge clock signal, the method further comprising:
    generating, by the first dynamic PI, a third center clock signal;
    generating, by the second dynamic PI, a fourth center clock signal;
    outputting, by a second static PI, a second edge clock signal based on the third and fourth center clock signals.

10. The method of claim 9, wherein the second static PI is a Complementary Metal Oxide Semiconductor PI.

11. The method of claim 9, wherein the fourth center clock signal is generated with a +90° phase shift from the third center clock signal.

12. The method of claim 9, wherein generating, by the first dynamic PI, the third center clock signal comprises generating an inverted signal from the first center clock signal.

13. The method of claim 9, wherein generating, by the second dynamic PI, the fourth center clock signal comprises generating an inverted signal from the second center clock signal.

14. The method of claim 9, further comprising:
    outputting, by the first and second static PIs, a third edge clock signal and a fourth edge clock signal respectively, the third edge clock signal being an inverted signal generated from the first edge clock signal, and the fourth edge clock signal being an inverted signal generated from the second edge clock signal.

15. The method of claim 14, further comprising using the first, second, third and fourth center clock signals and the first, second, third and fourth edge clock signals to sample a received data stream.

16. A system comprising a processor and a memory; the memory comprising instructions which, upon being executed by the processor:
    cause reception, by a first dynamic phase interpolator (PI), of:
        a first reference clock signal,
        a second reference clock signal having a +90° phase shift with the first reference clock signal,
        a third reference clock signal having a +90° phase shift with the second reference clock signal, and
        a fourth reference clock signal having a +90° phase shift with the third reference clock signal;

cause the first dynamic PI to generate a first center clock signal, a generation of the first center clock signal comprising:
  causing, by the processor, the first dynamic PI to receive a first phase code;
  causing, by the processor, the first dynamic PI to weight the first, second, third and fourth reference clock signals to adjust a phase of the first center clock signal;
cause a second dynamic PI to generate a second center clock signal; and
cause a static PI to output an edge clock signal based on the first and second center clock signals.

17. The system of claim 16, wherein the static PI is a first static PI and the edge clock signal is a first edge clock signal, and wherein the execution of the instructions by the processor further causes:
  the first dynamic PI to generate a third center clock signal;
  the second dynamic PI to generate a fourth center clock signal; and
  a second static PI to output a second edge clock signal based on the third and fourth center clock signals.

18. The system of claim 17, wherein the execution of the instructions by the processor further causes the first and second static PIs to output a third edge clock signal and a fourth edge clock signal respectively, the third edge clock signal being an inverted signal generated from the first edge clock signal, and the fourth edge clock signal being an inverted signal generated from the second edge clock signal, the first, second, third and fourth center clock signals and the first, second, third and fourth edge clock signals being further used to sample a received data stream.

* * * * *